(12) United States Patent
Chen et al.

(10) Patent No.: US 11,816,053 B2
(45) Date of Patent: Nov. 14, 2023

(54) HIGH-BANDWIDTH RECONFIGURABLE DATA ACQUISITION CARD

(71) Applicant: Brookhaven Science Associates, LLC, Upton, NY (US)

(72) Inventors: Kai Chen, Ridge, NY (US); Michael Begel, South Setauket, NY (US); Hucheng Chen, Wading River, NY (US); Francesco Lanni, Segny (FR)

(73) Assignee: Brookhaven Science Associates, LLC, Upton, NY (US)

( * ) Notice: Subject to any disclaimer, the term of this patent is extended or adjusted under 35 U.S.C. 154(b) by 120 days.

(21) Appl. No.: 17/428,810

(22) PCT Filed: Sep. 23, 2019

(86) PCT No.: PCT/US2019/052430
§ 371 (c)(1),
(2) Date: Aug. 5, 2021

(87) PCT Pub. No.: WO2020/180349
PCT Pub. Date: Sep. 10, 2020

(65) Prior Publication Data
US 2022/0100690 A1 Mar. 31, 2022

Related U.S. Application Data

(60) Provisional application No. 62/813,780, filed on Mar. 5, 2019.

(51) Int. Cl.
*G06F 13/40* (2006.01)
*H03K 19/14* (2006.01)
(Continued)

(52) U.S. Cl.
CPC ......... *G06F 13/4022* (2013.01); *H03K 19/14* (2013.01); *H04B 10/40* (2013.01); *H04J 3/0685* (2013.01)

(58) Field of Classification Search
None
See application file for complete search history.

(56) References Cited

U.S. PATENT DOCUMENTS 5,628,028 A 5/1997 Michelson
7,310,459 B1 12/2007 Rahman
(Continued)

OTHER PUBLICATIONS

Aad, Georges, et al., "The ATLAS Experiment at the CERN Large Hadron Collider," Journal of Instrumentation, vol. 3, Issue 08, S08003, pp. 1-407 (2008).

(Continued)

*Primary Examiner* — Farley Abad
*Assistant Examiner* — Dayton Lewis-Taylor
(74) *Attorney, Agent, or Firm* — Dorene Price

(57) ABSTRACT

A reconfigurable data acquisition card including at least one field programmable gate array (FPGA) and a configurable bus switch coupled with the FPGA. The bus switch forms at least first and second ports used by the FPGA, the bus switch being adaptable for insertion into a connection having a number of lanes at least equal to a combined number of lanes in the first and second ports. The data acquisition card further includes multiple optical transmitters and optical receivers. Each optical transmitter and optical receiver is coupled with a corresponding transceiver in the FPGA via at least one optical fiber having multiple communication links. Timing circuitry in the data acquisition card is coupled with clock generation and distribution circuitry in the FPGA and is configured to distribute clock and timing signals to detector front-ends with fixed latency and to synchronize input/output links with a system clock generated by the FPGA.

20 Claims, 5 Drawing Sheets

(51) Int. Cl.
*H04B 10/40* (2013.01)
*H04J 3/06* (2006.01)

(56) References Cited

U.S. PATENT DOCUMENTS

| | | |
|---|---|---|
| 9,407,426 B2 | 8/2016 | Blumenthal et al. |
| 2020/0127764 A1* | 4/2020 | Niu .................. H04L 69/22 |

OTHER PUBLICATIONS

Perić, Ivan, et al., "High-Voltage Pixel Detectors in Commercial CMOS Technologies for ATLAS, CLIC and Mu3e Experiments," Nuclear Instruments and Methods in Physics Research Section A: Accelerators, Spectrometers, Detectors and Associated Equipment, vol. 731, pp. 131-136 (2013).

Perić, I., et al., "Status of HVCMOS Developments for ATLAS," Journal of Instrumentation, vol. 12, No. 02, C02030, pp. 1-11 (2017).

Liu, H., et al., "Development of a Modular Test System for the Silicon Sensor R&D of the ATLAS Upgrade," Journal of Instrumentation, vol. 12, No. 01, P01008, pp. 1-9 (2017).

Benoit, M., et al., "The FE-I4 Telescope for Particle Tracking in Testbeam Experiments," Journal of Instrumentation, vol. 11, No. 07, P07003, pp. 1-12 (2016).

Anderson, J., et al., "FELIX: A High-Throughput Network Approach for Interfacing to Front End Electronics for ATLAS Upgrades," Journal of Physics: Conference Series., vol. 664, No. 8, IOP Publishing, pp. 1-8 (2015).

Anderson, John, et al., "A New Approach to Front-End Electronics Interfacing in the ATLAS Experiment," Journal of Instrumentation, vol. 11, No. 01, C01055, pp. 1-9 (2016).

Anderson, J., et al., "FELIX: A PCIe Based High-Throughput Approach for Interfacing Front-End and Trigger Electronics in the ATLAS Upgrade Framework," Journal of Instrumentation, vol. 11, No. 12, C12023, pp. 1-9 (2016).

Benoit, M., et al., "Testbeam Results of Irradiated Ams H18 HV-CMOS Pixel Sensor Prototypes," Journal of Instrumentation, vol. 13, No. 02, P02011, pp. 1-13 (2018).

Vilella, Eva, et al., "Prototyping of an HV-CMOS Demonstrator for the High Luminosity-LHC Upgrade," Journal of Instrumentation, vol. 11, No. 01, C01012, pp. 1-20 (2016).

Garcia-Sciveres, Maurice, et al., "The FE-I4 Pixel Readout Integrated Circuit," Nuclear Instruments and Methods in Physics Research Section A: Accelerators, Spectrometers, Detectors and Associated Equipment, vol. 636, No. 1, pp.S155-S159 (2011).

Chen, Hucheng, et al., "The Prototype Design ofgFEX—A Component of the L1Calo Trigger for the ATLAS Phase-Upgrade," 2016 IEEE Nuclear Science Symposium, Medical Imaging Conference and Room-Temperature Semiconductor Detector Workshop (NSS/MIC/RTSD), IEEE, pp. 1-5 (2016).

Coliban, R-M., et al.,"The Read Out Controller for the ATLAS New Small Wheel," Journal of Instrumentation, vol. 11, No. 02, C02069 (2016).

Xilinx, UltraScale Architecture GTH Transceivers, User Guide, May 13, 2021. Available: http://www .xilinx.com/support/documentation/user_guides/ug576-ultrascale-gth- transceivers.pdf.

Marin, M. Barros, et al., "The GBT-FPGA Core: Features and Challenges," Journal of Instrumentation, vol. 10, No. 03, C03021, pp. 1-10 (2015).

Hu-Guo, C, et al., "First Reticule Size MAPS with Digital Output and Integrated Zero Suppression for the EUDET-JRA1 Beam Telescope," Nuclear Instruments and Methods in Physics Research Section A: Accelerators, Spectrometers, Detectors and Associated Equipment, vol. 623, No. 1, pp. 480-482 (2010).

Xilinx, 7 Series FPGAs GTX/GTH Transceivers, User Guide, Aug. 14, 2018. Available: https ://www.xilinx.com/support/documentation/user_guides/ug476_7Series_Transceivers.pdf.

Xilinx, Ibert for UltraScale GTH Transceivers v. 1.3, LogiCORE IP Product Guide. Available: http://www.xilinx.com/support/documentation/ip_documentation/ibert_ ultrascale_gth/v1_3/pg173-ibert-ultrascale-gth.pdf.

Chen, Kai, et al., "Optimization on Fixed Low Latency Implementation of the GBT Core in FPGA," Journal of Instrumentation, vol. 12, No. 07, P07011, pp. 1-13 (2017).

Wu, W., et al., "Development of FELIX Based Readout System for HV-CMOS Sensor Testbeam," Journal of Instrumentation, vol. 14, No. 01, P01013, pp. 1-11 (2019).

PCT Written Opinion of the International Searching Authority dated Mar. 2, 2020.

Ryu, S. on behalf of the ATLAS TDAQ Collaboration, "FELIX: The new detector readout system for the ATLAS experiment," IOP Conf. Series: J Phys.: Conf. Ser. 898, 932057, pp. cover sheet, and 1-8 (2017).

* cited by examiner

HIGH-BANDWIDTH RECONFIGURABLE DATA ACQUISITION CARD

CROSS-REFERENCE TO RELATED APPLICATIONS

This application is a National Phase application of International Application No. PCT/US2019/052430 filed on Sep. 23, 2019, which claims priority to U.S. Provisional Patent Application No. 62/813,780, filed on Mar. 5, 2019, entitled "High Bandwidth Reconfigurable Data Acquisition Card," the disclosures of which are hereby incorporated by reference herein in their entirety for all purposes.

STATEMENT OF GOVERNMENT RIGHTS

This invention was made with government support under contract number DE-SC0012704 awarded by the U.S. Department of Energy. The government has certain rights in the invention.

BACKGROUND

The present invention relates generally to the electrical, electronic and computer arts, and, more particularly, to high-bandwidth data acquisition hardware for use by a computing device.

Data acquisition is the well-known process of sampling signals, generally analog in nature, that measure real world physical conditions and converting the resulting samples into digital numeric values that can be more easily manipulated by a computing device (e.g., personal computer (PC)). Data acquisition systems typically convert the measured analog signals into digital values for further processing.

A data acquisition (DAQ) card usually refers to the hardware that interfaces between the measured signals and a computer. DAQ hardware could be in the form of physical modules that can be connected to the computer's ports (e.g., parallel, serial, Universal Serial Bus (USB), etc.), or cards connected to slots in the computer motherboard (e.g., S-100 bus (IEEE-696), AppleBus, Industry Standard Architecture (ISA), Micro Channel Architecture (MCA), Peripheral Component Interconnect (PCI), PCI Express (PCIe), etc.). DAQ cards often contain multiple components, including an analog-to-digital converter (ADC), which, via a bus, are interconnected with and accessible by a microcontroller running a data acquisition application program.

The term reconfigurable stems from its ability to refresh a hardware configuration during operation by loading new tasks on the programming fabric. It may be used in cases where high bandwidth data transmission is desired between a PC server and detector front-ends in a whole system.

SUMMARY

Principles of the present invention, as manifested in one or more embodiments thereof, are directed to a high-bandwidth data acquisition card that exploits the flexibility of a field programmable gate array (FPGA) to support an expanded number of bidirectional data links (e.g., 48), compared to conventional data acquisition cards, and thereby functions as a high-throughput interface between a host PC and front-end electronics of different detector and/or sub-detector systems. Furthermore, one or more embodiments of the data acquisition card provide increased flexibility to accept system clock, trigger and control signals from different external systems to thereby more easily interface with various applications and experiments in which the data acquisition card may be employed.

In accordance with one embodiment, a high-bandwidth reconfigurable data acquisition apparatus includes at least one FPGA and a configurable bus switch coupled with the FPGA. The bus switch forms at least first and second ports for use by the FPGA, the bus switch being adaptable for insertion into a connection having a number of lanes at least equal to a combined number of lanes in the first and second ports. The data acquisition card further includes multiple optical transmitters and optical receivers. Each optical transmitter and optical receiver is coupled with a corresponding transceiver in the FPGA via at least one optical fiber having multiple communication links. Timing circuitry included in the data acquisition card is coupled with clock generation and distribution circuitry in the FPGA. The timing circuitry is configured to distribute clock and timing signals to detector front-ends connected to the data acquisition card with fixed latency and to synchronize input/output links with a system clock generated by the FPGA. As may be used herein, "facilitating" an action includes performing the action, making the action easier, helping to carry the action out, or causing the action to be performed. Thus, by way of example only and without limitation, in the context of a processor-implemented method, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps.

Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, a data acquisition card according to one or more embodiments of the invention may provide one or more of the following advantages:

- exploits the flexibility of an FPGA to support an expanded number of bidirectional data links, thereby providing a high-bandwidth interface between a host PC and front-end electronics of different detector systems;
- provides reconfigurable timing circuitry to accept system clock, trigger and control signals from different external systems to thereby more easily interface with various applications and experiments in which the data acquisition card may be employed;

employs on-board optical fiber links between the FPGA and data input and output connections to improve signal integrity and reduce signal losses in the data acquisition card;

utilizes enhanced timing circuitry to distribute clock and timing signals to detector front-ends with fixed latency and to synchronize the input/output links with the system clock;

includes a microcontroller and corresponding jumpers for firmware selection and version control, as well as remote firmware update capability via the PCIe bus; and utilizes an integrated PCIe switch to eliminate the special requirement of PCIe bifurcation on the PC motherboard.

These and other features and advantages of the present invention will become apparent from the following detailed description of illustrative embodiments thereof, which is to be read in connection with the accompanying drawings.

BRIEF DESCRIPTION OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments thereof, will be described herein in the context of illustrative high-bandwidth reconfigurable data acquisition hardware (e.g., DAQ cards) and/or data acquisition systems. It is to be appreciated, however, that the invention is not limited to the specific devices and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

A high-bandwidth reconfigurable data acquisition card according to one or more embodiments of the invention may comprise a platform that exploits the flexibility of a field programmable gate array (FPGA) to achieve an adaptable protocol to interface different detector front-ends. The name reconfigurable in the context of the present data acquisition card may also refer to a niche in pattern recognition, artificial intelligence, neural networks, cryptography, signal processing, and in general parallel computing by using slices and digital signal processing (DSP) blocks in the FPGA.

Beneficially, the data acquisition card according to one or more aspects of the present invention may factorize front-end electronics from data handling with a compact, high-density, scalable, low maintenance, easily upgradeable, and commodity-based solution. It may also eliminate, or at least reduce, a need for custom hardware in favor of scalable detector-independent commercial off-the-shelf (COTS) hardware and software. As will be described in further detail below, by using different configurations of a timing mezzanine card, the novel data acquisition card according to one or more embodiments may be advantageously adapted for use in different experiments, such as, but not limited to, particle physics, nuclear physics and astrophysics.

Figure 1:
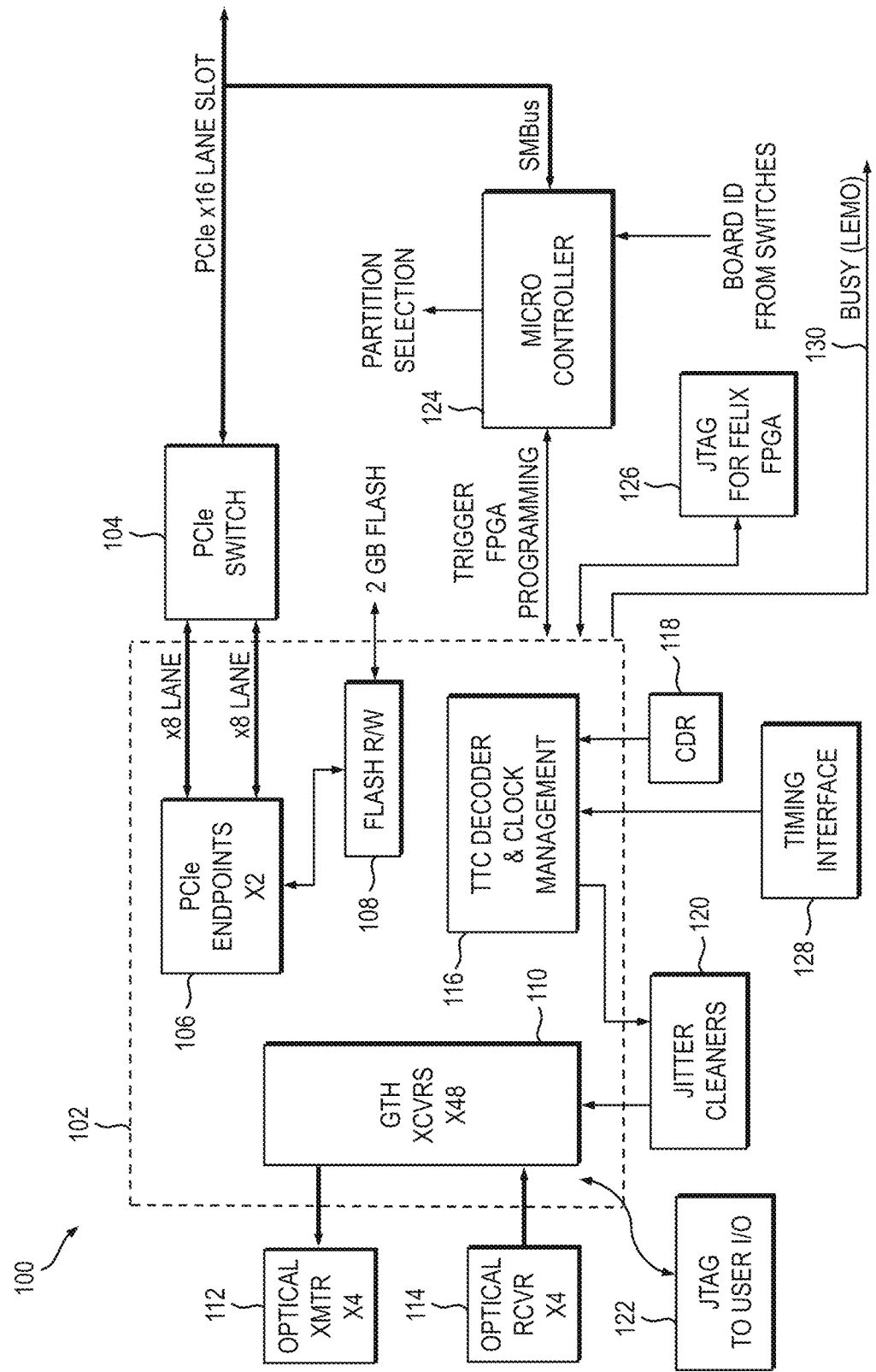
FIG. 1 is a block diagram depicting at least a portion of an exemplary data acquisition card without double data rate 4 (DDR4) memory, according to an embodiment of the present invention.

With reference now to FIG. 1, a block diagram depicts at least a portion of an exemplary data acquisition card 100, according to an embodiment of the invention. By way of example only and without limitation or loss of generality, the illustrative data acquisition card 100 is implemented using an industry standard PCI Express (PCIe) communication protocol, although it is to be appreciated that embodiments of the invention are not limited to any particular communication protocol. A PCIe connection consists of one or more (e.g., up to sixteen) data-transmission lanes, connected serially. Each PCIe lane contains two pairs of wires; one for transmitting and one for receiving. Packets of data move across the lane at a rate of one bit per cycle. An x1 connection, the smallest PCIe connection, has one lane made up of four wires. There are generally 1, 4, 8 or 16 lanes in a single PCIe slot. Furthermore, although not explicitly shown for clarity, the data acquisition card 100 preferably includes one or more memory modules (e.g., DDR4 memory) which may be used for data buffering, as will become apparent to those skilled in the art.

The data acquisition card 100 includes an FPGA 102 (e.g., Kintex® Ultrascale™ FPGA XCKU115-2FLVF1924E, manufactured by Xilinx, Inc.) and a PCIe switch 104 (e.g., ExpressLane™ PEX 8732, manufactured by Broadcom Inc.) in operative communication with one another. Integrated in the FPGA 102 are PCIe endpoints 106, flash read/write (R/W) firmware 108 coupled with the PCIe endpoints, and a plurality of gigabit transceivers (GTH) 110 (e.g., 48 in this example), among other circuit elements.

The PCIe switch 104, in this embodiment, is configured to form two 8-lane PCIe ports from the FPGA 102, which can be inserted into a standard 16-lane PCIe slot in a host computing device or server. One benefit of this arrangement is that the PCIe switch 104 does not necessarily require the mother board to have bifurcation capability. The FPGA 102 may support only an 8-lane PCIe connection. The PCIe switch 104 may be used between the FPGA 102 and the 16-lane PCIe edge connector. This may allow the data acquisition card 100 to be used in a lower cost commodity PC server which may not support PCIe bifurcation.

The PCIe endpoints 106 are coupled with the respective 8-lane ports of the PCIe switch 104. The PCIe endpoints 106, in one or more embodiments, provide a path for software to communicate with the flash R/W firmware 108, for transferring data and commands between software and the flash R/W firmware. The flash R/W firmware 108 coupled to the PCIe endpoints 106 is the firmware used to read and write a flash memory device (e.g., 2 GB flash) coupled with the flash R/W firmware. The flash R/W firmware 108, in conjunction with the flash memory, can be used to support remote firmware upgrades through the PCIe bus.

In order to achieve enhanced high-frequency performance, among other benefits, the data acquisition card 100 preferably includes at least one high-density, high-speed optical fiber link (e.g., comprising 12 links) to interface between the FPGA 102 and front-end electronics. Specifically, the GTH transceivers 110 integrated in the FPGA 102 are in operative communication with a plurality of optical transmitters 112 and a plurality of optical receivers 114. In one or more illustrative embodiments, the GTH transceivers 110 preferably support 48 input links (e.g., optical fibers) at a data rate of 12.8 Gb/s and 48 output links (e.g., optical fibers) at the same speed, and conversion between optical and electrical signals is achieved through four 12-channel, pluggable, parallel optical fiber transmitters 112 (e.g., Mini-POD™ AFBR-814Vx1Z, manufactured by Avago Technologies) and four 12-channel, pluggable, parallel optical fiber receivers 114 (e.g., MiniPOD™ AFBR-824Vx1Z, manufactured by Avago Technologies), thereby providing a robust front-end interface for incoming and outgoing signals on the data acquisition card 100.

The data acquisition card 100, in one or more embodiments, preferably also includes circuitry used for clock generation, data recovery and clock management, among other functions. For example, the FPGA 102 in this illustrative embodiment comprises a timing, trigger and control (TTC) decoder and clock management circuit 116. The TTC decoder and clock management circuit 116, which may be realized as firmware in the FPGA 102, is configured to generate a system clock signal as a function of an input timing signal received from a clock and data recovery (CDR) circuit 118 (e.g., ADN2814, manufactured by Analog Devices, Inc.) in operative communication with the TTC decoder and clock management circuit. The CDR circuit 118, in one or more embodiments, resides externally to the FPGA 102 and preferably includes a phase locked loop (PLL) or similar circuitry configured to recover the clock signal and/or other timing information from a data signal received by the data acquisition card 100. Various clock and data recovery techniques suitable for use with embodiments of the invention will be known by those skilled in the art, including, for example, edge detection, non-return-to-zero (NRZ) sampling, PLL or other phase detection (e.g., linear and binary phase detection, rotational frequency detection, etc.), and the like.

The system clock signal generated by the TTC decoder and clock management circuit 116 is supplied to one or more jitter cleaner circuits 120 residing on the data acquisition card 100, in at least one embodiment. Each of the jitter cleaner circuits 120 is preferably a zero-delay mode circuit used on-board to clean (i.e., remove noise, etc. from the clock signal) the system clock. Together with the design of the FPGA high-speed transceivers 110, the jitter cleaner circuits 120 are configured to distribute clock and other important timing signals to detector front-ends with fixed latency. The jitter cleaner circuits 120 also provide cleaned clock signals to the FPGA transceivers 110, which beneficially allows all links to be synchronized to the system clock generated by the TTC decoder and clock management circuit 116. In one or more embodiments, two clock jitter cleaners 120 supporting zero-delay mode are used to clean the system clock and to generate reference clocks for the high-speed optical links, and to support a fixed latency. This may also advantageously allow data conveyed in the optical fiber links to be synchronized.

The data acquisition card 100 preferably provides at least a first interface port 122 to user input/output (I/O), such as, for example, through a Joint Test Action Group (JTAG) port, or the like. As will be known by those skilled in the art, JTAG implements standards for on-chip instrumentation in electronic design automation (EDA) as a complementary tool to digital simulation. JTAG standards, some of which are codified in the Institute of Electrical and Electronics Engineers (IEEE) Standard 1149.1-1990, specifies the use of a dedicated debug port implementing a serial communications interface for low-overhead access without requiring direct external access to the system address and data buses. The interface connects to an on-chip Test Access Port (TAP) that implements a stateful protocol to access a set of test registers that present chip logic levels and device capabilities of various parts. The first interface port 122 is preferably used to communicate with one or more external detectors and/or sensors coupled with the data acquisition card 100. In one or more embodiments, the first interface port 122 is beneficially used to configure FPGAs on the front-ends of the external detectors/sensors via optical links. This novel approach essentially eliminates, or at least substantially reduces, signal loss and provides a mechanism for robust remote programmability between the data acquisition card 100 and the external detectors and/or external sensors.

The illustrative data acquisition card 100 may also optionally include one or more double data rate 4 (DDR4) small outline dual in-line memory module (SO-DIMM) memory devices (not explicitly shown for clarity, but implied) which support, for example, up to 6 GB of storage for data buffering. A microcontroller 124, or other processor, may be used for firmware version control and loading. The microcontroller 124 is preferably coupled with a system management bus (SMBus), which may be derived from the main the PCIe bus connection, for providing low-speed system management communications. In one or more embodiments, SMBus carries clock, data, and instructions and is based on Philips Semiconductor's Inter-Integrated Circuit ($I^2C$) serial bus protocol. The microcontroller 124 generates one or more output signals, such as, for example, a trigger FPGA programming signal and a partition selection signal, as a function of commands received from the SMBus as well as a status of one or more board ID switches, which the microcontroller 124 is configured to receive as an input. The partition selection signal may be used to select one of the segments in the flash memory device (e.g., 2 GB flash).

A second interface (I/O) port 126 may be optionally included on the data acquisition card 100 for configuring the FELIX FPGA 102, according to one or more embodiments. Total power consumption for the data acquisition card 100 with all links running at 12.8 Gb/s is expected to be about 65 watts (W), which is less than the standard 150 W limitation of the PCIe slot.

In one or more embodiments, the data acquisition card 100 optionally includes a third interface port, which may comprise a LEMO connector ("Busy (LEMO)"), alternative "push-pull" connector, or the like. The third interface port is preferably used, for example, to output status information to other boards in operative communication with the data acquisition card 100. The third interface port thus functions in a manner consistent with a general purpose I/O connection.

As previously stated, the microcontroller 124 is preferably configured to receive board ID status as an input. Board ID status may be controlled as a function of one or more jumpers on the data acquisition card 100. More particularly, the data acquisition card 100, in one more embodiments, may use the microcontroller 124 and jumpers (not explicitly shown, but implied) for firmware selection and/or version control. For example, two 3-pin jumpers and one microcontroller (e.g., ATMEGA324A, manufactured by Microchip Technology Inc.) can be used on the data acquisition card 100, in one or more embodiments. The flash memory on board may be capable of storing four firmware bit files. The jumpers can be used to select firmware that is to be loaded when the data acquisition card 100 is powered on. A computing device (e.g., personal computer (PC)) can communicate with the microcontroller 124 via the SMBus, the PCIe bus and FPGA. Together with a PCIe hotplug feature, this allows the firmware to be loaded online to thereby remotely update/upgrade the firmware. The flash memory, in one or more embodiments, is designed for updating via the PCIe bus and FPGA firmware. This remote firmware update capability can be desirable, especially in applications where a large number of data acquisition cards are being used (e.g., ATLAS experiment).

By way of illustration only and without limitation, in an exemplary embodiment, the data acquisition card 100 is implemented on a 16-layer printed circuit board (PCB), including 7 signal layers, 4 ground layers and 5 power layers. It is to be appreciated, however, that embodiments of the invention are not limited to any specific number of PCB layers or signal, power and ground layer assignments. In one or more embodiments, the PCB is a laminate structure preferably employing, for example, Megatron 6 insulating material (manufactured by Panasonic Corporation) between patterned (i.e., etched) conductive connection layers. Megatron 6 is an advanced circuit board laminate material designed for high-speed applications such as network equipment, mainframes, IC testers, and high-frequency measuring instruments. Megatron 6 material is best known for its low dielectric constant and dielectric dissipation factors, as well as low transmission loss and high thermal resistance. Signal routing on the board is carefully laid out to achieve superior signal integrity and crosstalk performance. For differential pairs except the DDR4 SO-DIMM memory-related signals, the impedance is controlled to be about 100 ohms. For differential pairs of DDR4, the impedance is designed to be 86 ohms and 66 ohms; single-ended lines except DDR4 signals are designed with an impedance of 50 ohms, and for DDR4 signals they are 39 ohms.

For the 12.8 Gb/s traces, blind via technology may be used to decrease a stub length and guarantee signal integrity. The usage of blind vias may also make traces capable of being routed within limited signal layers, and therefore may be utilized where limited space on a small PCIe card must meet certain specifications. Signal converters, operative to convert optical signals to electrical signals, are preferably located near the FPGA to minimize signal distortion and signal loss. The exemplary board preferably has two 1-oz power planes, although embodiments of the invention are not limited to any specific copper thickness used for the power planes, capable of distributing a large electrical current to the FPGA while minimizing voltage drop. Furthermore, a remote sense function may be used to compensate for voltage drop. In a remote voltage sensing arrangement, the voltage present at one or more circuit nodes, distributed across the PCB or at certain critical locations on the PCB, are monitored and compared against a reference voltage or voltages, and any differences in voltage beyond a prescribed tolerance limit can be compensated by controlling a voltage generator circuit or similar means, as will become apparent to those skilled in the art.

In one or more embodiments, the data acquisition card 100 may optionally include a timing interface circuit 128 in operative communication with the TTC decoder and clock management circuit 116. The timing interface circuit 128 is preferably configurable (e.g., user programmable) to interface with various timing systems with which the data acquisition card 100 may be employed, such as, for example, ATLAS TTC system, Large Hadron Collider (LHC) timing, trigger and control system based in passive optical networks (TTC-PON), White Rabbit (a fully deterministic Ethernet-based network for general purpose data transfer), or other clocking systems using small form-factor pluggable (SFP) format. The timing interface circuit 128 may reside, in one or embodiments, on a separate board (e.g., a timing mezzanine board, described in further detail herein below), removably connected to the main data acquisition card 100, configured for use with a specific timing system.

Figure 2:
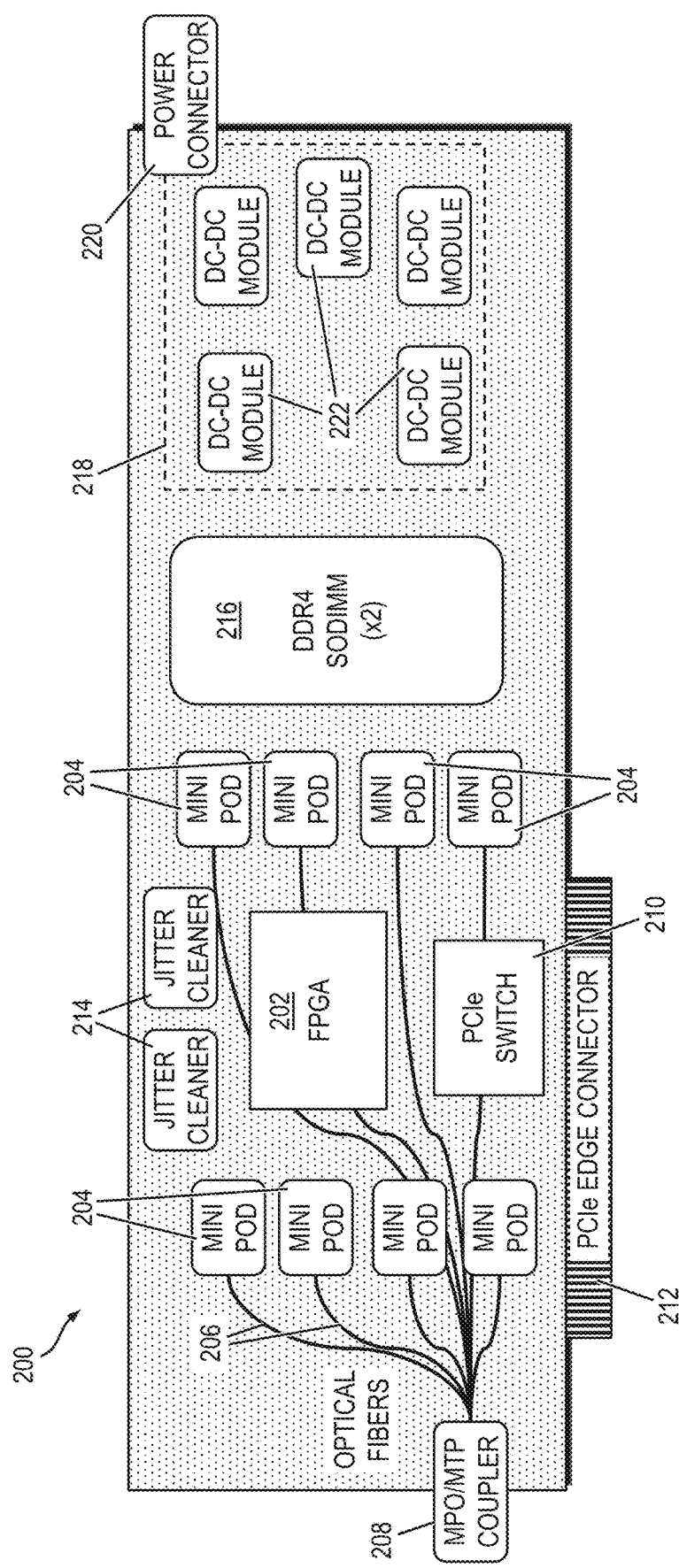
FIG. 2 is an image depicting a printed circuit board comprising an exemplary data acquisition card with two DDR4 memory connectors, according to an embodiment of the present invention.
Figure 3:
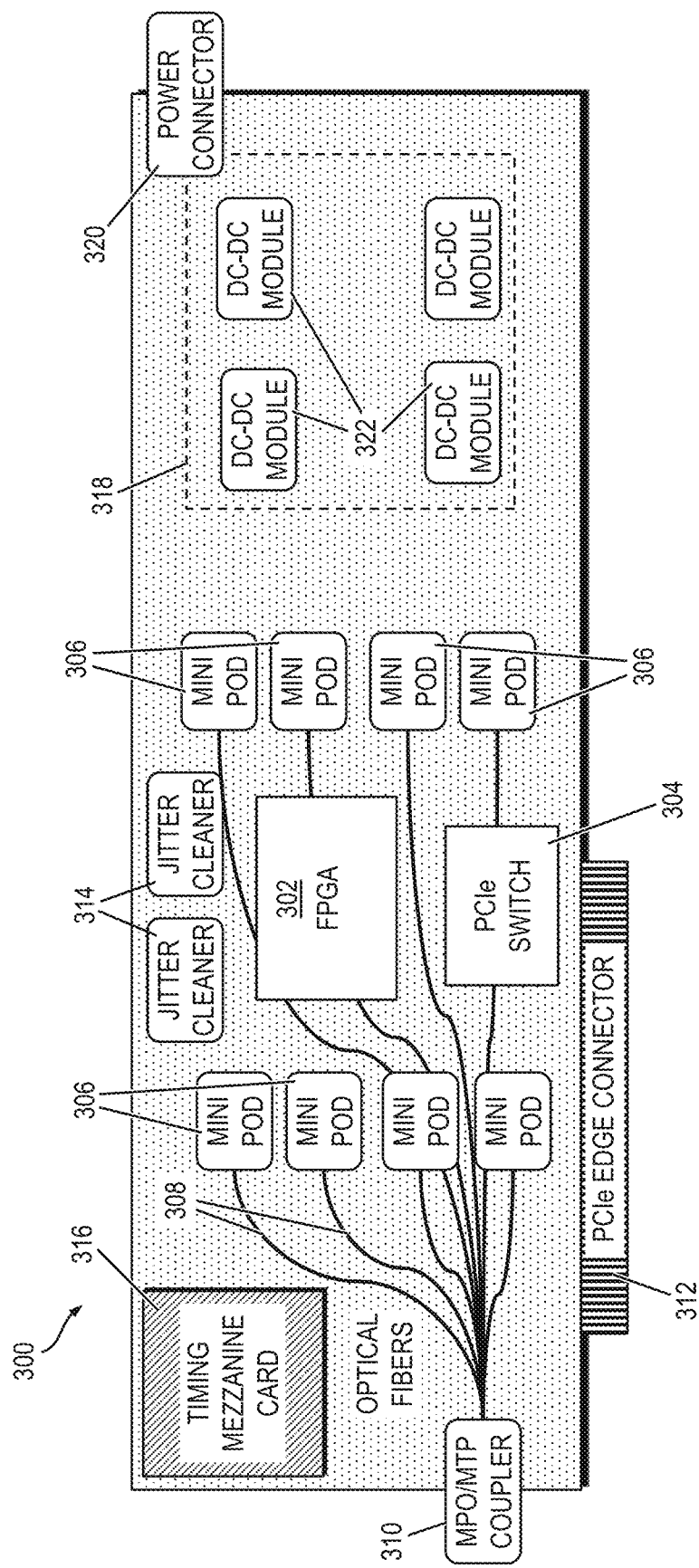
FIG. 3 is an image depicting a printed circuit board comprising an exemplary data acquisition card without DDR4 memory and including a timing mezzanine, according to an embodiment of the present invention.

FIGS. 2 and 3 are top plan printed circuit board images depicting two different versions of exemplary data acquisition cards 200 and 300, respectively, according to embodiments of the invention. The illustrative data acquisition card 200 shown in FIG. 2 includes two DDR4 SO-DIMM connectors, while the illustrative data acquisition card 300 shown in FIG. 3 does not include DDR4 memory. With reference to FIG. 2, the data acquisition card 200 is implemented on a PCB that includes an FPGA 202 (e.g., Xilinx XCKU115) and a plurality of optical transmitters and receivers 204 (e.g., MiniPODs™) disposed in close relative proximity to the FPGA 202 (e.g., on left and right sides of the FPGA, in this example) and corresponding optical fiber cables (i.e., links) 206 which, in conjunction with a multi-fiber push-on/multi-fiber termination push-on (MPO/MTP) coupler 208 used for joining two or more fiber optical cables/links, minimize the need for long copper traces which can contribute to voltage drops, parasitic impedance (e.g., capacitance and inductance), signal loss and crosstalk, among other signal integrity problems.

The data acquisition card 200 includes a PCIe switch 210 (e.g., Broadcom PEX8732) coupled between the FPGA 202 and a PCIe edge connector 212. As previously stated, the PCIe switch 210 alleviates the need for the motherboard to have bifurcation capability, thereby advantageously allowing the data acquisition card 200 to be used in low-cost commodity PC servers which do not support PCIe bifurcation. The data acquisition card 200 comprises two zero-delay mode clock jitter cleaners 214 adapted to generate a clean reference system clock from the timing system. Together with proper design of the FPGA high-speed transceivers, the clock jitter cleaners 214 are configured to distribute clock and/or other important timing signals to detector front-ends with fixed latency, as well as providing cleaned clocks to all transceivers for synchronizing all links to the system clock generated by the timing system.

The data acquisition card 200, in this exemplary embodiment, optionally includes two DDR4 SO-DIMM connectors 216 adapted to receive corresponding memory devices which support, for example, up to 16 GB of storage for data buffering; the type of connectors used will be dependent on, and correspond to, the type and size of the memory devices employed, as will become apparent to those skilled in the art. It is to be understood that embodiments of the present invention are not limited to any specific type of memory, amount (i.e., size) of memory storage, or number of memory connectors used on the data acquisition card 200.

The data acquisition card 200, in accordance with aspects of the present invention, preferably includes voltage generator circuitry adapted to provide improved power distribution. More particularly, the data acquisition card 200, in one or more embodiments, includes a voltage generator circuit 218 that is configured to receive a common higher system voltage (e.g., from a power connector 220 or the like), which is distributed, for example, along a periphery of the data acquisition PCB. The voltage generator circuit 218 preferably includes a plurality of direct current-to-direct current (DC-DC) converters (modules) 222, each DC-DC converter being configured to locally generate, as an output thereof, one or more lower reference voltages as a function of the system voltage. The respective voltages generated by the DC-DC converters 222 need not be the same, but rather may be adapted specifically to meet the requirements of the circuit(s) to which the DC-DC converters are connected.

The DC-DC converters 222 may be disposed in close relative proximity to the FPGA 202 and/or other circuits or functional modules where the reference voltages are actually being used. In this manner, a more precise local voltage is generated at each point of use and individually adapted to the circuit component for which the voltage is being used, thereby eliminating or at least reducing voltage drops caused by inherent parasitic resistance associated with the PCB traces or other connections between the voltage generator circuit and the point at which such voltages are ultimately used. This approach differs from conventional methodologies that employ single-point voltage generation, which is often subjected to power losses attributable to resistance in the PCB traces, as well as other factors (e.g., crosstalk, noise injection, etc.).

Each voltage generation point (e.g., DC-DC converter 222), or at least a subset thereof, may incorporate a voltage sensor (not explicitly shown, but implied) configured to monitor the voltage level present at a given local point of use. Multiple voltage sensor outputs may be monitored remotely by a centralized voltage detector circuit (e.g., included in the voltage generator circuit 218), which may be configured, in one or more embodiments, to provide individual control over each local voltage generated by the DC-DC converters 222 for maintaining a stable reference voltage at each point of use despite changes in load current or other factors (e.g., temperature). Voltage detection and monitoring techniques suitable for use with embodiments of the invention will be known by those skilled in the art (e.g., capacitive or resistive voltage dividers, operational amplifiers, resistive bridge sensors, etc.).

With reference now to FIG. 3, a second version of an illustrative data acquisition card 300 is shown without DDR4 connectors, according to an embodiment of the invention. The data acquisition card 300 includes an FPGA 302 (e.g., Xilinx XCKU115), which may include an optional cooling fan attached thereto (not explicitly shown), and a PCIe switch 304 (e.g., Broadcom PEX8732), operatively coupled with the FPGA. Like the data acquisition card 200 shown in FIG. 2, the data acquisition card 300 of FIG. 3 includes a plurality of optical transmitters and receivers 306 (e.g., MiniPODs™) disposed in close relative proximity to the FPGA 302 (e.g., on left and right sides of the FPGA) and corresponding fiber optic links 308 which, together with a MPO/MTP coupler 130, eliminate the need for long copper PCB traces or wires which otherwise contribute to voltage drops, parasitic impedance (e.g., capacitance and inductance), signal loss, crosstalk, and other signal integrity issues. Furthermore, the use of optical fiber links 308 in place of copper wires or PCB traces eliminates, or at least reduces, the need for on-board impedance matching components (e.g., decoupling capacitors, inductors, etc.), which can consume valuable space on the PCB.

The data acquisition card 300 includes a PCIe edge connector 312 operatively coupled with the PCIe switch 304. As previously stated, the PCIe switch 304 alleviates the need for the motherboard to have bifurcation capability, thereby advantageously allowing the data acquisition card 300 to be used in low-cost commodity PC servers which do not support PCIe bifurcation.

In a manner consistent with the data acquisition card 200 of FIG. 2, one or more embodiments of the data acquisition card 300 comprises two zero-delay mode clock jitter cleaners 314 placed in close relative proximity to the FPGA 302 and adapted to generate a clean reference system clock from the timing system. Together with proper design of the FPGA high-speed transceivers, the clock jitter cleaners 314 are adapted to distribute clock and/or other important timing signals to detector front-ends with fixed latency, as well as providing cleaned clocks to the transceivers for synchronizing all data I/O links to the system clock.

The data acquisition card 300, in one or more embodiments, comprises a timing mezzanine 316. The timing mezzanine 316 is a smaller PCB (relative to the main data acquisition PCB) that includes timing interface circuitry configured to provide a flexible interface for use with different timing systems and environments in which the data acquisition card 300 may be used. Specifically, in one or more embodiments of the invention, the timing mezzanine 316 is populated with different configurations of timing components to interface with different timing systems, such as, for example, ATLAS TTC system, LHC TTC-PON system, or White Rabbit.

In order to save space, the timing mezzanine 316, in one or more embodiments, is preferably implemented as a separate smaller PCB that is disposed (e.g., in a stacked manner) over a portion of the main data acquisition card 300. The timing mezzanine 316 may be operatively coupled to the main data acquisition card 300 by way of a plug and socket connection arrangement, or other removable connection mechanism that may be known by those skilled in the art, so that the timing mezzanine can be easily removed and swapped with a different timing mezzanine for flexible interfacing to various external timing systems with which the respective timing mezzanines are configured to operate.

The data acquisition card 300, like the data acquisition card 200 shown in FIG. 2, preferably includes voltage generator circuitry adapted to provide enhanced power distribution. More particularly, the data acquisition card 300, in one or more embodiments, includes a voltage generator circuit 318 configured to receive a common higher system voltage from a power connector 320 and distributed, for example, along a periphery of the data acquisition PCB. The voltage generator circuit 318 includes a plurality of DC-DC converters 322, each DC-DC converter configured to locally generate, as an output thereof, one or more lower reference voltages as a function of the system voltage. The DC-DC converters 322 are preferably disposed in close relative proximity to the FPGA 302 and/or other circuits or functional modules where the reference voltages are actually being used. In this manner, a more precise local voltage is generated at each point of use and individually adapted to the circuit component for which the voltage is being used.

As previously explained, each of the DC-DC converters 322, or at least a subset thereof, may incorporate a voltage sensor (not explicitly shown, but implied) configured to monitor the voltage level present at a given local point of use. Multiple voltage sensor outputs may be monitored remotely by a centralized voltage detector circuit, which may be configured, in one or more embodiments, to provide individual control over each local voltage generated by the DC-DC converters 322 to thereby maintain a stable reference voltage at each point of use despite changes in load current or other factors (e.g., temperature). Voltage detection and monitoring techniques suitable for use with embodiments of the invention will be known by those skilled in the art.

Exemplary Data Acquisition Card Application

A data acquisition card formed in accordance with one or more embodiments of the invention is well-suited for use in conjunction with the ATLAS experiment at CERN (European Organization for Nuclear Research). ATLAS is a general-purpose particle physics experiment run by an international collaboration and, together with CMS (Compact Muon Solenoid), is designed to exploit the full discovery potential and the huge range of physics opportunities that the Large Hadron Collider (LHC) provides. ATLAS is one of the four major experiments at the LHC at CERN. ATLAS employs several different sub-detectors each having their own front-end electronics and corresponding timing systems. Therefore, the reconfigurable nature of the data acquisition card according to embodiments of the invention for supporting multiple timing systems, as well as the ability to handle a large bandwidth of data, beneficially facilitates the transfer of detector data from the front-end electronics to a commodity PC server via the PCIe interface of the data acquisition card.

Figure 4:
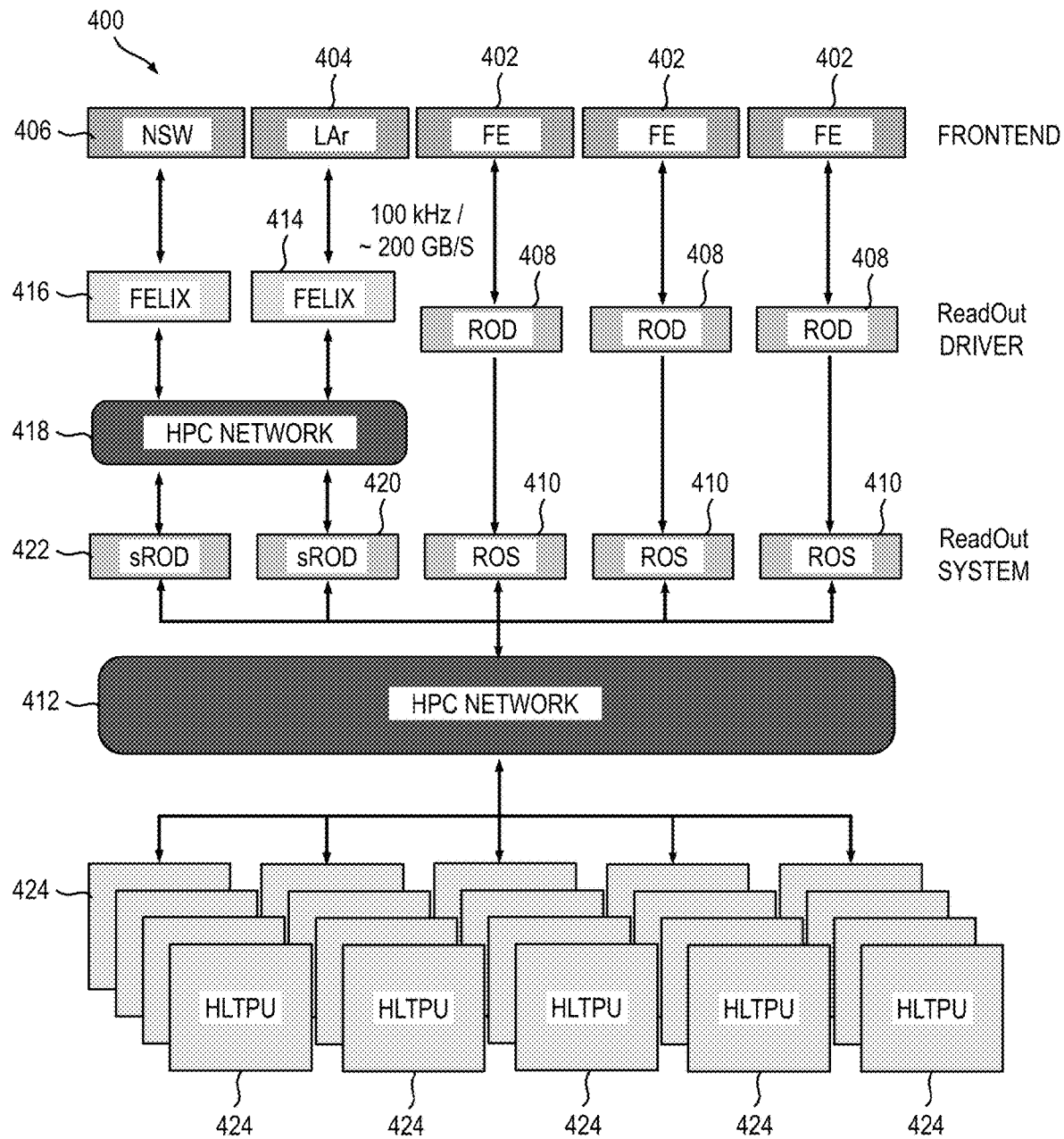
FIG. 4 is a block diagram conceptually depicting at least a portion of an exemplary data acquisition system in which aspects of multiple reconfigurable data acquisition cards according to embodiments of the present invention may be utilized in FELIX servers to support about 2,000 bidirectional data links with front-end.

FIG. 4 is a block diagram depicting at least a portion of an exemplary data acquisition system 400 in which aspects of a reconfigurable data acquisition card according to embodiments of the present invention may be utilized. The data acquisition system 400 includes a plurality of front-end (FE) electronics 402 used in the ATLAS experiment, two of the front-end electronics, 404 and 406, being used by liquid argon (LAr) calorimeters and muon New Small Wheel (NSW) detectors, respectively. The front-end electronics 402 are preferably coupled to respective ReadOut drivers (ROD) 408 via fiber optical links, which are in turn coupled to respective ReadOut systems (ROS) 410. Each of the ReadOut systems 410 is coupled to a high performance computing (HPC) network 412, such as, for example, an Ethernet network. The LAr and NSW detectors 404, 406 are coupled to data acquisition cards 414 and 416, respectively, which are in turn coupled to a local HPC network 418, which may be, for example, an Ethernet network. The local HPC network 418 is preferably coupled to corresponding ReadOut systems, so called ReadOut drivers (swROD) 420 and 422, which in turn are connected to the HPC network 412. The HPC network 412 is coupled to a plurality of high-level trigger processing units (HLTPU) 424 for processing event data from the detectors captured by the data acquisition card. In this illustrative example, the data acquisition card in accordance with one or more embodiments of the invention is implemented in the FELIX boards 414, 416; the FELIX boards 414, 416 act as servers with the data acquisition card and a network interface card (NIC) plugged in.

Figure 5:
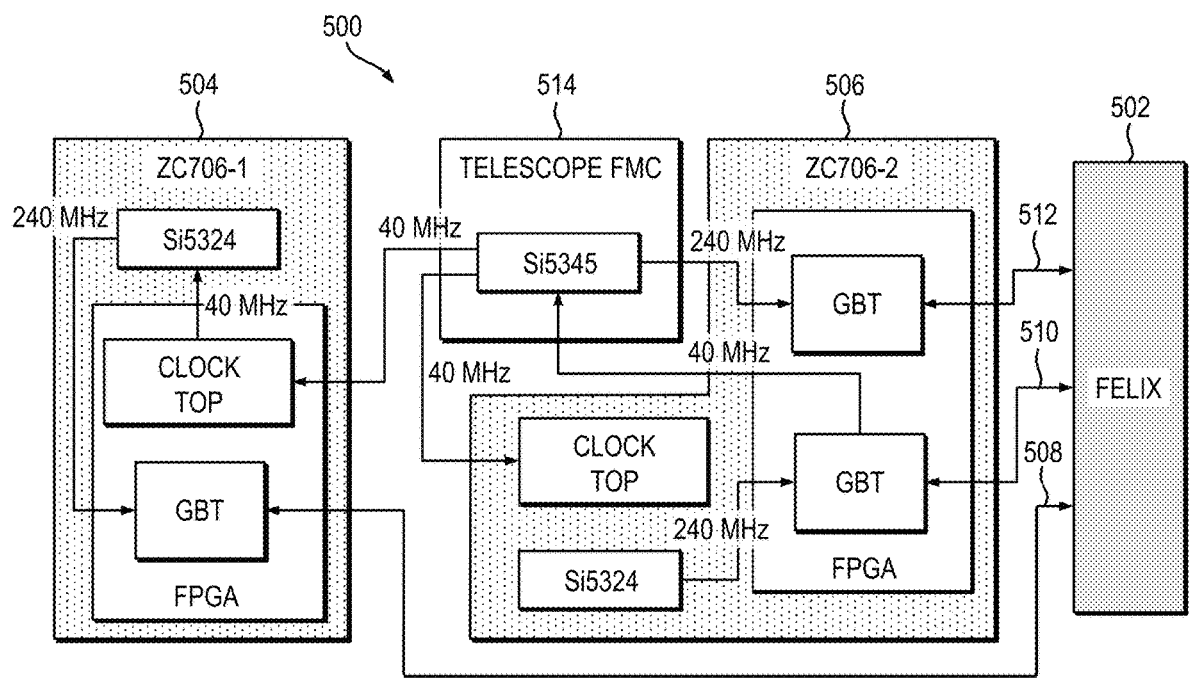
FIG. 5 is a block diagram conceptually depicting an exemplary case in which a data acquisition card according to an embodiment of the present invention is used in a FELIX back-end, illustrating how the front-end will recover a clock signal from this card, and synchronize clocks in the whole system, according to an embodiment of the present invention.

With reference now to FIG. 5, a block diagram depicts at least a portion of an exemplary clock distribution system 500 for interfacing the data acquisition card with the front-end electronics, according to an embodiment of the invention. As apparent from FIG. 5, the clock distribution system 500 includes a data acquisition card 502, formed according to one or more embodiments of the invention, in operative communication with a first ZC706 FPGA evaluation board 504 and a second ZC706 FPGA evaluation board 506. As previously stated, the data acquisition card 502 preferably generates separate local timing/clock signals, supplied through the gigabit transceivers (GBT) links, 508, 510 and 512, in corresponding evaluation boards 504, 506. The timing signals are specifically configured according to the design requirements of the particular GBTs. The recovered clock from the FELIX GBT link may be used as the input for an Si5345 chip on a Telescope FMC card 514. Its 240 MHz output channel may be used as a reference clock for the data link in the second ZC706 FPGA evaluation board 506, and 40 MHz output clocks may be used as the system clock for the two ZC706 FPGA evaluation boards 504, 506. The Si5324 chip on the first FPGA evaluation board 504 may be used to generate a reference clock of the data link on the first FPGA evaluation board 504. Advantageously, with this configuration, the clocks in the first and second evaluation boards 504, 506 will all be synchronized to the clock distributed from the data acquisition card 502.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A reconfigurable data acquisition card, comprising:
   at least one field programmable gate array (FPGA);
   a configurable bus switch in operative communication with the FPGA, a bus switch forming at least first and second ports for use by the FPGA, the bus switch being adaptable for insertion into a connection having a number of lanes at least equal to a combined number of lanes in the first and second ports;
   a plurality of optical transmitters and optical receivers, each of the optical transmitters and optical receivers being coupled with a corresponding transceiver in the FPGA via at least one optical fiber comprising a plurality of communication links; and
   timing circuitry coupled with clock generation and distribution circuitry in the FPGA, the timing circuitry being configured to distribute clock and timing signals to detector front-ends connected to the data acquisition card with fixed latency and to synchronize input/output links with a system clock generated by the FPGA.

2. The data acquisition card of claim 1, wherein the bus switch comprises a Peripheral Component Interconnect Express (PCIe) switch, the PCIe switch having a plurality of ports with a configurable allocation of lane widths among the ports.

3. The data acquisition card of claim 1, further comprising at least one jitter cleaner circuit coupled with the FPGA, the jitter cleaner circuit being a zero-delay mode circuit configured to generate a clean clock signal from a received system clock, the clean clock signal being supplied to at least a subset of transceivers in the FPGA.

4. The data acquisition card of claim 3, wherein the at least one jitter circuit in conjunction with the transceivers in the FPGA are configured to distribute one or more timing signals to detector front-ends, in operative communication with the data acquisition card, with fixed latency and thereby synchronize data conveyed by the input/output links with the system clock.

5. The data acquisition card of claim 1, further comprising a clock and data recovery (CDR) circuit configured to recover a timing signal from data received by the data acquisition card, and wherein the FPGA further comprises a timing, trigger and control (TTC) decoder and clock management circuit, the TTC decoder and clock management circuit being configured to generate a system clock signal as a function of the timing signal received from the CDR circuit.

6. The data acquisition card of claim 5, further comprising a timing interface circuit operatively connected to the TTC decoder and clock management circuit, the timing interface circuit including timing components specifically configured to support at least one of a plurality of timing protocols for interfacing with different timing systems with which the data acquisition card can be used.

7. The data acquisition card of claim 6, wherein the timing systems comprise at least one of ATLAS TTC system, Large Hadron Collider (LHC) TTC system based in passive optical networks (TTC-PON), and White Rabbit timing system.

8. The data acquisition card of claim 6, wherein the timing interface circuit is removably connected to the data acquisition card.

9. The data acquisition card of claim 1, further comprising at least one microcontroller coupled with the FPGA and a communication bus to which the data acquisition card is connected, the microcontroller being configured to generate one or more control signals for programming the FPGA as a function of at least one of commands received from the communication bus and status information corresponding to the data acquisition card.

10. The data acquisition card of claim 9, wherein the one or more control signals generated by the at least one microcontroller comprises at least one of a trigger FPGA programming signal and a partition selection signal.

11. The data acquisition card of claim 9, wherein status information received by the at least one microcontroller comprises a configuration of a plurality of jumpers on the data acquisition card, the configuration of the jumpers being selectable by a user.

12. The data acquisition card of claim 11, wherein a firmware version of the FPGA is selected at power-on as a function of the configuration of the jumpers.

13. The data acquisition card of claim 1, further comprising a voltage generator circuit, the voltage generator circuit being configured to receive a system voltage and to generate one or more local reference voltages as a function of the system voltage, an amplitude of the reference voltages being lower than an amplitude of the system voltage.

14. The data acquisition card of claim 13, wherein the voltage generator circuit comprises a plurality of direct current-to-direct current (DC-DC) converters, each of the DC-DC converters individually generating a corresponding one of the local reference voltages.

15. The data acquisition card of claim 13, further comprising a remote voltage sensing circuit coupled with the voltage generator circuit, the remote voltage sensing circuit comprising:
- a plurality of sensors disposed at prescribed locations on the data acquisition card, each of the sensors being adapted to monitor a voltage level of one or more circuit nodes in proximity to the sensor; and
- a controller coupled with the plurality of sensors, the controller being adapted to compare each of the respective voltage levels from the sensors with corresponding reference voltages and to modify the local reference voltage generated by a given one of the DC-DC converters when the local reference voltage of the given one of the DC-DC converters is beyond a prescribed threshold value of the corresponding reference voltage.

16. The data acquisition card of claim 1, further comprising at least a first interface port coupled with the FPGA, the first interface port being configured to communicate with at least one of external detectors and external sensors coupled with the data acquisition card.

17. The data acquisition card of claim 16, wherein the first interface port is configured to communicate with the at least one of the external detectors and the external sensors via corresponding optical links.

18. The data acquisition card of claim 17, further comprising at least a second interface port coupled with the FPGA, the second interface port being configured to provide remote access for programming the FPGA on the data acquisition card.

19. The data acquisition card of claim 18, wherein at least one of the first and second interface ports comprises a Joint Test Action Group (JTAG) port.

20. The data acquisition card of claim 1, wherein the at least one optical fiber comprises at least twelve communication links.

* * * * *